(12) United States Patent
Taniguchi et al.

(10) Patent No.: US 6,992,356 B2
(45) Date of Patent: Jan. 31, 2006

(54) SEMICONDUCTOR DEVICE

(75) Inventors: Koichi Taniguchi, Kyoto (JP); Naoki Nojiri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/806,250

(22) Filed: Mar. 23, 2004

(65) Prior Publication Data

US 2004/0188763 A1    Sep. 30, 2004

(30) Foreign Application Priority Data

Mar. 28, 2003   (JP)   ............................. 2003-090630

(51) Int. Cl.
*H01L 23/62*   (2006.01)

(52) U.S. Cl. ........................ 257/355; 257/355; 257/357
(58) Field of Classification Search ................. 257/355, 257/357, 360, 758
See application file for complete search history.

(56) References Cited

U.S. PATENT DOCUMENTS 5,892,276 A    4/1999   Miki et al.
6,008,542 A   12/1999   Takamori
6,236,117 B1 *  5/2001   Ishigaki et al. ............. 257/734

FOREIGN PATENT DOCUMENTS

JP    P2000-164620 A    6/2000

* cited by examiner

*Primary Examiner*—David Nelms
*Assistant Examiner*—Thinh T Nguyen
(74) *Attorney, Agent, or Firm*—McDermott Will & Emery LLP

(57) ABSTRACT

In an I/O circuit unit located in the periphery of a semiconductor chip, a plurality of ESD protection transistors are provided in each I/O cell. An electrode pad cell has a two-layer structure including a lower electrode pad and an upper electrode pad. The electrode pad cell is arranged so as to be present over a connection line of ESD protection transistors of an associated I/O cell. With part of the first pad portion of an adjacent electrode pad located in an end portion of the second pad portion of the electrode pad, the second pad portion can not extend further onward but the third pad portion having a smaller width than that of the second pad portion is arranged onward. Thus, destruction of the ESD protection transistors is not caused, so that an internal circuit is protected from an electrostatic discharge which comes into electrode pads.

13 Claims, 13 Drawing Sheets

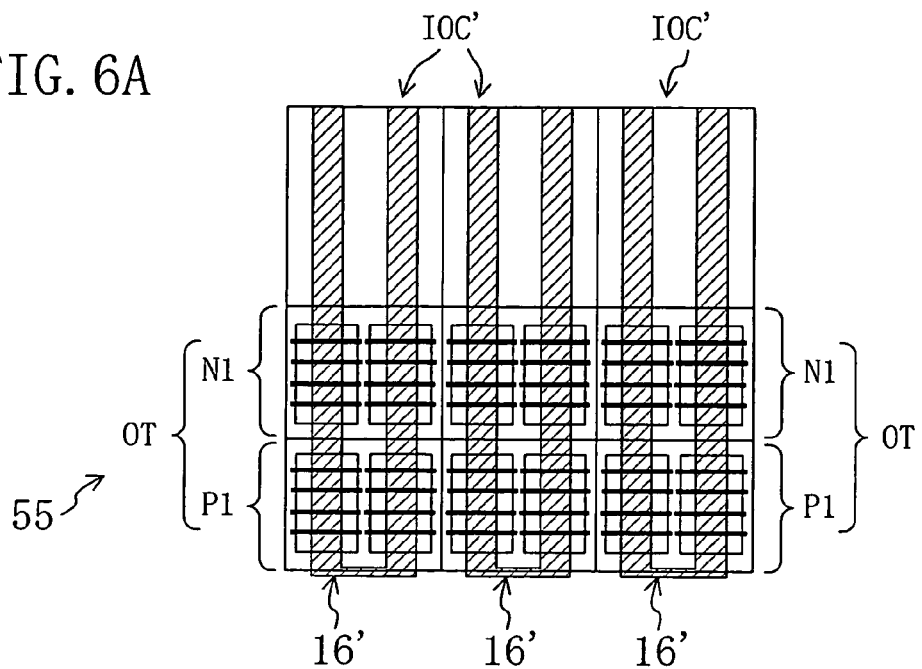
FIG. 6A
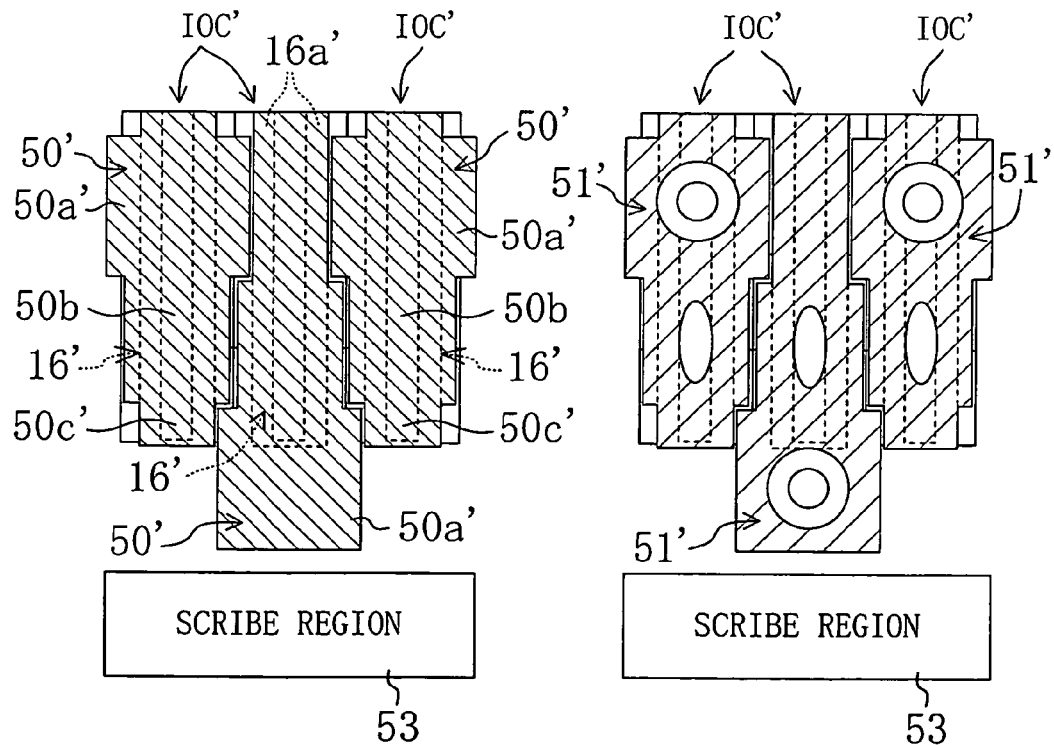
FIG. 6B
FIG. 6C

PRIOR ART

FIG. 12A
FIG. 12B
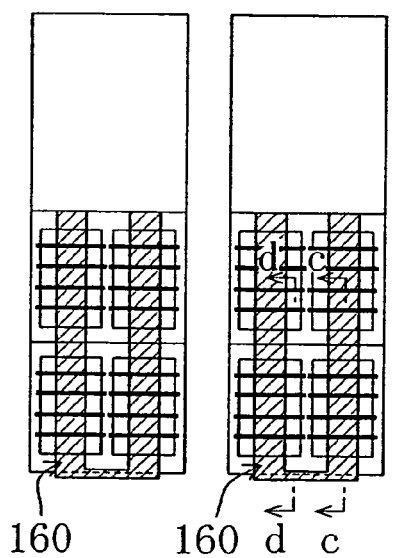
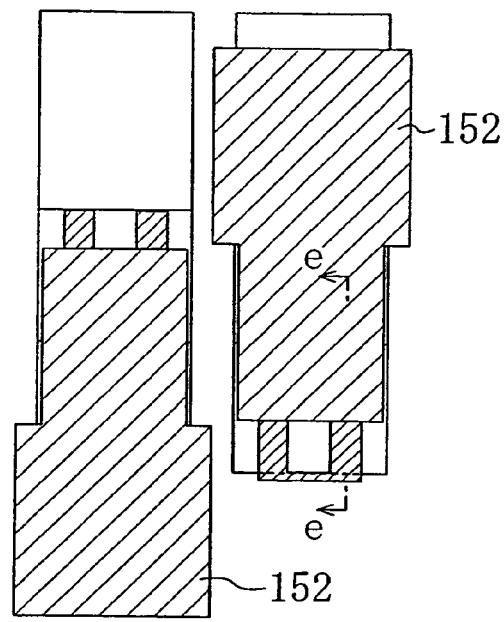
FIG. 12C
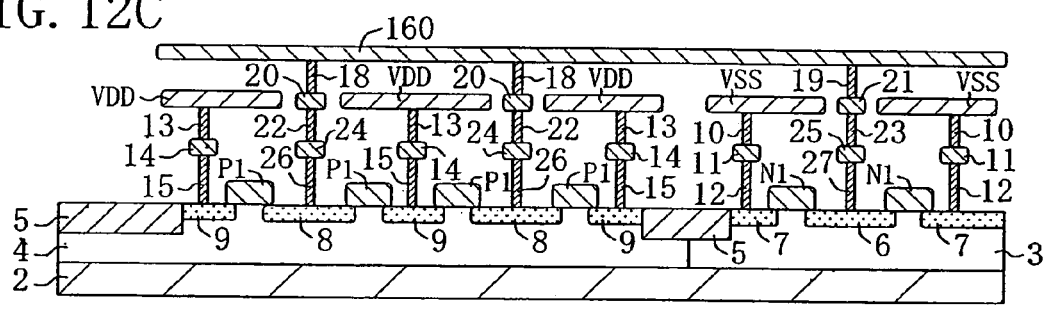
FIG. 12D
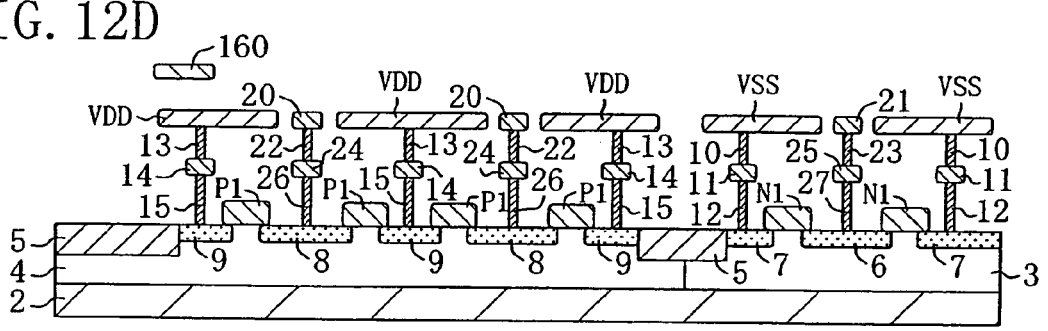
FIG. 12E
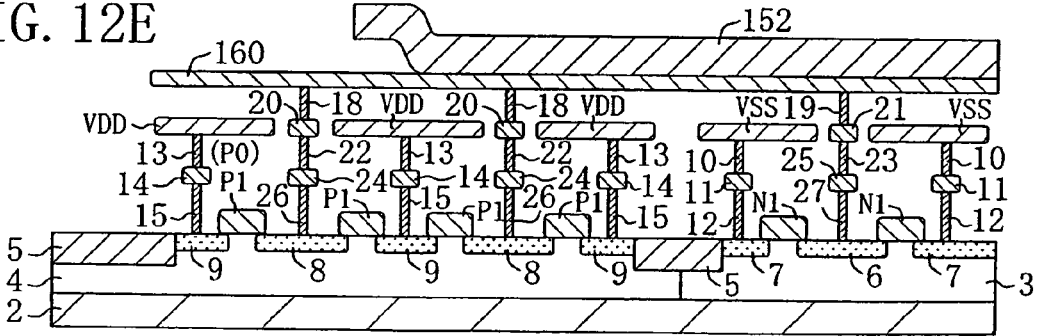

SEMICONDUCTOR DEVICE

BACKGROUND OF THE INVENTION

The present invention relates to semiconductor devices and more particularly relates to improvement of an I/O circuit unit including an output transistor for transmitting an output of an internal circuit to the outside and a protection transistor for protecting the internal circuit from an electrostatic discharge (ESD) from the outside.

In a semiconductor integrated circuit, generally, an I/O circuit unit for performing input/output between the outside and an internal circuit is provided in the periphery of a semiconductor chip and the I/O circuit unit includes a plurality of electrode pads. Hereinafter, the structure of a known I/O circuit unit will be described.

FIG. 7 is a circuit diagram of a known I/O circuit unit. In FIG. 7, P101 denotes a p-type MOS transistor, and the source thereof is connected to a power line VDD. N101 denotes an n-type MOS transistor, and the source thereof is connected to a ground line VSS. The respective drains of the MOS transistors P101 and N101 are connected to each other and a node of the MOS transistors P101 and N101 is connected to an electrode pad 102. A series circuit of the p-type MOS transistor P101 and the n-type MOS transistor N101 constitutes an output transistor OT. The output transistor OT is provided plural in number and the plurality of output transistors OT (two output transistors OT in FIG. 7) are connected in parallel with one another. The output transistors OT all have the same structure, and also function as ESD protection transistors.

FIG. 8 is a specific layout of the I/O circuit unit. FIG. 9 is a cross-sectional view taken along the line 1—1 shown in FIG. 8. Note that a gate insulating film and an interlayer insulating film for providing an insulation between wiring layers are not shown in FIG. 8 and FIG. 9.

In FIGS. 8 and 9, 2 denotes a p-type semiconductor substrate, 3 and 4 denote p-type and n-type wells formed on the semiconductor substrate 2, respectively. Two separate NMOS transistors N1 are provided on the p-type well 3, and two separate PMOS transistors P1 are provided on the n-type well 4. The n-type MOS transistors N1 are isolated from the p-type MOS transistors P1 by an isolation region 5. Moreover, in FIGS. 8 and 9, 6 and 7 denote n-type doped regions, which serve as the drain and source of the n-type MOS transistors N1, respectively, and 8 and 9 denote p-type doped regions, which serve as the drain and source of the p-type MOS transistors P1, respectively. Furthermore, VSS denotes a ground line provided in the second wiring layer and VDD denotes a power line provided in the second wiring layer.

The ground line VSS at the ground potential is connected to the n-type doped region 7 serving as the source of the n-type MOS transistor N1 via a via hole 10, an isolated wiring region 11 provided in a first wiring layer, and a via hole 12. In the same manner, the power line VDD at a predetermined potential is connected to the p-type doped region 9 serving as the source of the p-type MOS transistors P1 via a via hole 13, an isolated wiring region 14 provided in the first wiring layer and a via hole 15. Furthermore, 17 denotes an electrode pad provided in the third wiring layer (i.e., an uppermost wiring layer). The electrode pad 17 is located in the periphery of the semiconductor chip and in FIGS. 8 and 9, the electrode pad 17 is provided on the right of the n-type doped region 7 serving as the source of the n-type MOS transistors N1. In addition, 16 denotes a metal line provided on the wiring layer (i.e., the uppermost wiring layer) in which the electrode pad 17 is provided, and connected to the electrode pad 17 at a position close to the right end of the structure shown in FIGS. 8 and 9. Moreover, the metal line 16 is connected to the p-type doped region 8 serving as the drain of the p-type MOS transistors P1 via a stacked via structure including a via hole 18, an isolated wiring region 20 provided in the second wiring layer, a via hole 22, an isolated wiring region 24 provided in the second wiring layer, and a via hole 26, and also connected to the p-type doped region 6 serving as the drain of the n-type MOS transistors N1 via a stacked via structure including a via hole 19, an isolated wiring region 21 provided in the second wiring layer, a via hole 23, an isolated wiring region 25 provided in the first wiring layer, and a via hole 27.

By the way, as the structure of an electrode pad in an I/O circuit unit having the above-described structure, a multi-stepped electrode pad is disclosed in Japanese Laid-Open Patent Publication No. 2000-164620. The electrode pad includes a multi-stepped electrode pad having a relatively wide bonding electrode region 150 and a relatively narrow test electrode region 151, as shown in FIG. 10. The bonding electrode region 150 has a large area enough to reliably allow bonding, and the test electrode region 151 has a small area with which a probe-pin of a test tool is brought into contact. When a test using a probe-pin is conducted, only the test electrode region 151 is used and a probe mark is left only in the test electrode region 151. Thus, bonding to the bonding electrode region 150 can be favorably performed. The electrode pad 152 is provided plural in number. The plurality of electrode pads 152 are arranged in a zigzag manner. Note that in FIG. 10, 153 denotes an I/O circuit unit and 154 denotes a wiring for connecting each of the electrode pads 152 and the I/O circuit unit 153.

In recent years, there has been a strong demand to reduce the size of equipment, for example, portable equipment, in which a semiconductor integrated circuit is provided. With relation to this demand, the size of a semiconductor integrated circuit itself is desired to be reduced.

In response to this demand for reduction in the size of a semiconductor integrated circuit, a POE (pad on element) structure in which an electrode pad is provided over an output transistor which also functions as an ESD protection transistor (and which will be hereinafter referred to as an ESD protection transistor) is considered to be adopted for the purpose of reduction in the size of an I/O circuit unit of a semiconductor integrated circuit. In the POE structure, an electrode pad, a wiring region for connecting the electrode pad to an I/O circuit unit are not needed. Thus, reduction in the size of a semiconductor integrated circuit can be expected.

However, when the above-described multi-stepped structure is used for an electrode pad, the following defect occurs.

Specifically, the multi-stepped electrode pads 152 shown in FIG. 10 is set so that the bonding electrode region 150 has a minimum area for performing a favorable bonding and the test electrode region 151 is set to have a small area in which a probe-pin of a test tool can be favorably in contact with the test electrode region 151. Thus, for example, as shown in FIG. 11, when the respective electrode pads 152 of two adjacent cells A are provided so that one of the electrode pads is arranged reversely to the other, the following problem arises. In FIG. 11, the two adjacent electrode pads 152 are provided so that one of the electrode pads is arranged reversely to the other to satisfy a separation rule between bonding electrode regions 150, and at the same time, test electrode regions 151 are arranged substantially in line so that the probe-pin of the test tool can be brought into contact with the test electrode regions 151 in a simple manner. In this arrangement, in each of the cells A, an I/O circuit unit 155 including an ESD protection transistor is not covered with the electrode pads 152 but only part of the I/O circuit unit 155 is covered with an associated one of the test electrode regions 151. In this case, for example, as shown in FIG. 12A, in each of the cells A, a connection line 160 connected to electrode pads is formed in an uppermost wiring layer located over all of the ESD protection transistors OT so that all of the ESD protection transistors OT are connected to the electrode pads 152. As shown in FIG. 12C illustrating a cross-sectional view taken along the line c—c shown in FIG. 12A, the connection line 160 is connected to the n-type doped region 6 constituting the drain of the n-type MOS transistors N1 via via holes 19, 23 and 27 and isolated wiring regions 21 and 25 and is also connected to the p-type doped region 8 constituting the drain of the p-type MOS transistors P1 via via holes 18, 22 and 26 and isolated wiring region 20 and 24. Assume that the connection line 160 for connecting electrode pads is provided in this manner. As shown in FIG. 12B, when an associated one of the electrode pads 152 is provided over one of the cells A, the electrode pad 152 is not present over an end portion of the connection line 160 connected to electrode pads. Accordingly, as shown in FIG. 12E illustrating a cross-sectional view taken along the line e-e shown in FIG. 12B, the electrode pad 152 is not present over several p-type MOS transistors P1, among MOS transistors (i.e., the p-type MOS transistors P1 of FIG. 12E) constituting the ESD protection transistors, located in an end portion (one p-type MOS transistor P1 in FIG. 12E). Therefore, the connection impedance differs between one of the p-type MOS transistors P1 (particularly, denoted by P0 given in a parenthesis) located at the end portion over which the electrode pad 152 is not present and another one of the p-type MOS transistors P1 located under the electrode pad 152. As a result, since the impedance differs between the ESD protection transistors OT, as described above, a positive or negative voltage of an electrostatic discharge which has come into the electrode pads 152, and ideally, is to be evenly applied to between several ESD protection transistors OT to be released out via each of the ESD protection transistors OT, is not evenly applied thereto and is concentrated. This adversely results in destruction of the ESD protection transistors.

Note that in FIG. 12A, the n-type MOS transistors N101 and the p-type MOS transistors P101 constituting the ESD protection transistors OT are provided so that the n-type MOS transistors N101 and the p-type MOS transistors P101 are arranged in two lines, respectively. Moreover, FIG. 12D is a cross-sectional view taken along the line d—d shown in FIG. 12A.

Moreover, as shown in FIG. 13, when by reducing the width of the cells A to shorten a pitch between the cells A, the cells A are arranged so that no space is provided therebetween in order to dispose a large number of the cells A in the periphery of the semiconductor chip, an arrangement in which the test electrode region 151 of one of the two adjacent ones of the electrode pads 152 and the test electrode region 151 of the other one of the two adjacent electrode pads 152 are provided with no space therebetween is obtained. In this arrangement, an edge portion of the test electrode region 151 of one of the two adjacent electrode pads 152 is interrupted by the wide bonding electrode region 150 of the other of the two adjacent electrode pads 152. As a result, even when it is intended to make the edge portion of the test electrode region 151 extend to reach a further point, the edge portion of the test electrode region 151 can not go beyond the bonding electrode region 150 of the other one of the two adjacent electrode pads 152.

Furthermore, as shown in FIG. 13, even though the pitch between the cells A is shortened, a certain width has to be ensured for the bonding electrode region 150 of each of the electrode pads 152 so that bonding is reliably performed. Therefore, the width of the bonding electrode region 150 is set to be a larger than that of the cells A. Accordingly, the bonding electrode region 150 of each of the electrode pads 152 extends beyond an associated one of the cells A in the inward direction of an adjacent one of the cells A. In that case, the connection line 160 connected to electrode pads is provided in the adjacent one of the cells A. If the bonding electrode region 150 of the electrode pad 152 of the adjacent one of the cells A, which extends in the inward direction of the associated one of the cells A, is present over the connection line 160, the connection line 160 of the cell A and the electrode pad 152 of the adjacent one of the cells A are unintentionally connected to each other.

SUMMARY OF THE INVENTION

It is therefore an object of the present invention to reduce the area of an I/O circuit unit provided in the periphery of a semiconductor chip while effectively protecting an internal circuit from an electrostatic discharge without causing destruction of an ESD transistor and allowing, whatever shape an electrode pad provided over the cell has, favorable connection between a cell and an electrode pad at any time.

To achieve the object, according to the present invention, an electrode pad is present over a connection line of an ESD protection transistor provided in an I/O cell at any time. Moreover, a measure is taken so that even when an electrode pad having a larger width than that of a cell has part extending over an adjacent cell in the inward direction of the adjacent cell, a connection line connected to an electrode pad and provided in an uppermost layer is set at a specific position, thereby keeping a connection line of the cell from being located under the electrode pad.

Specifically, a semiconductor device of the present invention is a semiconductor device in which a plurality of cells each including an output transistor formed on a substrate and a protection circuit having a plurality of protection transistors for protecting an internal circuit from an electrostatic discharge are arranged in line, characterized in that each said cell includes an electrode pad which outputs an output of the output transistor to the outside and is connected to the plurality of protection transistors of the protection circuit, and each of the electrode pads of the plurality cells is located over an associated one of the plurality of the cells, and the electrode pads are arranged in a zigzag manner and are present over a connection line of the plurality of protection transistors of the protection circuit provided in the associated one of the cells.

The present invention is characterized in that in the semiconductor device, the electrode pad of each said cell includes three or more pad portions which have different widths and are sequentially connected to one another and is formed in a multi-step structure having a protruding portion and a recessed portion.

The present invention is characterized in that in the semiconductor device, the electrode pads of each said cell includes a first pad portion having the largest width, a second pad portion having the second largest width, and a third pad portion having the smallest width.

The present invention is characterized in that in the semiconductor device, one of the plurality of the pad portions having the smallest width is present over at least a center portion of at least one of the plurality of protection transistors of the protection circuit located in an end portion.

The present invention is characterized in that in the semiconductor device, one of the pad portions having the largest width has a larger width than that of the associated cell and has part extending by a predetermined distance over an adjacent one of the plurality of cells in the inward direction of the adjacent cell.

The present invention is characterized in that in the semiconductor device, each said cell includes a line provided in an uppermost layer so as to be connected to the electrode pad for outputting to the outside an output of the output transistor of each said cell, and the line is provided at a larger distance than the predetermined distance from an end portion of the associated cell in the inward direction of the associated cell.

The present invention is characterized in that in the semiconductor device, the electrode pad of one of the plurality of the cells and the electrode pad of an adjacent one of the plurality of the cells are provided so that one of the electrode pads is arranged reversely to the other.

The present invention is characterized in that in the semiconductor device, a protruding portion of one of the respective electrode pads of the two adjacent cells fits in a recessed portion of the other one of the electrode pads.

The present invention is characterized in that in the semiconductor device, in the electrode pad of one of the plurality of cells, one of the pad portions having the smallest width or one of the pad portions having the largest width has part extending in the inward direction of the inner circuit.

The present invention is characterized in that in the semiconductor device, the electrode pad is a power supply terminal pad for supplying a predetermined voltage to the inner circuit.

The present invention is characterized in that in the semiconductor device, an external connection line for outputting to the outside an output of the output transistor is bonded to one of the pad portions having the largest width.

The present invention is characterized in that in the semiconductor device, a test probe-pin for testing the internal circuit is brought into contact with a predetermined one of the pad portions other than one of the pad portions having the largest width.

Another semiconductor device of the present invention is a semiconductor device in which a plurality of cells each including an output transistor formed on a substrate are arranged in line, characterized in that each said cell includes a line provided in an uppermost layer to be connected to the electrode pad for outputting to the outside an output of the output transistor, and the line is provided at a predetermined distance inwardly from a width-direction end portion of the cell.

The present invention is characterized in that in the semiconductor device, the electrode pad provided over an associated one of the plurality of cells includes a pad portion having a larger width than that of the associated cell, and the predetermined distance, i.e., a distance between the line and a width-direction end portion the associated cell in which the line is provided is set to be a larger distance than a distance by which part of the pad portion extends in the inward direction of an adjacent cell to the associated cell beyond the width of the associated cell.

As has been described, according to the present invention, an electrode pad for performing input/output with the outside is present over a cell to form a POE structure. Therefore, the area of an I/O circuit unit can be effectively reduced.

Moreover, the electrode pads of a plurality of cells are arranged in a zigzag manner. Thus, even if a pitch between the plurality of cells is shortened, a separation between adjacent two electrode pads can be set to be a relatively large distance, so that a separation rule between electrode pads can be satisfied. Furthermore, an electrode is present over a connection line for connecting a protection transistor of a cell to an electrode pad at any time, so that the impedance between an electrode and a protection transistor is substantially constant. Accordingly, a high voltage of an electrostatic discharge which has come into electrode pads is applied uniformly to protection transistors, so that respective operations of the transistors become uniform. Therefore, destruction of the protection transistors is not caused and an internal circuit can be effectively protected from an electrostatic discharge.

Moreover, according to the present invention, an electrode pad includes at least three pads having different widths and has a multi-stepped structure including a protruding portion and a recessed portion. Thus, even when adjacent electrode pads are provided so that one of the electrodes is arranged reversely to the other and then the protruding portion of one of the adjacent electrode pads fits in the recessed potion of the other electrode pad, a portion of the one of the adjacent electrode pads having a small width is not interrupted by the other electrode pad and can extend further onward. Accordingly, it is possible to provide an electrode pad so as to be present over the connection line of a protection transistor of an associated cell at any time.

Furthermore, according to the present invention, adjacent electrode pads are provided so that one of the electrode pads is arranged reversely to the other. Thus, pad cells of one type can be used for pad cells each having an electrode pad.

In addition, according to the present invention, a pad portion of an electrode pad having the smallest width extends to reach the inside of the internal circuit. Thus, when the electrode pad is used as a power supply pad, a voltage drop caused in supplying a supply voltage can be effectively reduced. Therefore, a favorable power supply becomes possible.

Moreover, according to the present invention, in a cell, a line which is connected to an electrode and provided in an uppermost layer is provided at a predetermined distance from an end portion of the cell in the inward direction. Thus, even if the width of the electrode pad of an adjacent cell to the cell is large and part of the electrode pad of the adjacent cell extends over the cell, it is possible to keep the part of the electrode pad of the adjacent cell from being located over the line connected to the electrode pad of the cell. Accordingly, I/O cells of one type which can correspond to a variety of electrode pads such as an electrode having a smaller width than that of a cell or an electrode having a larger width than that of a cell can be provided. Therefore, efficiency in development of libraries of I/O cells IOC can be increased.

BRIEF DESCRIPTION OF THE DRAWINGS

FIG. 6A is a plan view illustrating an arrangement of an I/O cell forming part of an I/O cell circuit portion, i.e., a semiconductor device according to a second embodiment of the present invention; FIG. 6B is a plan view illustrating an arrangement of lower one of two layers constituting an electrode pad cell forming part of the I/O circuit unit; and FIG. 6C is a plan view illustrating an arrangement of upper one of the two layers constituting the electrode pad cell.

FIGS. 12A through 12E are views of an inventive I/O circuit unit; FIG. 12A is a plan view illustrating an I/O cell forming part of the I/O circuit unit; FIG. 12B is a plan view of an arrangement in which an electrode pad is present over the I/O cell; FIG. 12C is a cross-sectional view taken along the line c—c of FIG. 12A; FIG. 12D is a cross-sectional view taken along the line d—d of FIG. 12A; and FIG. 12E is a cross-sectional view taken along the line e—e of FIG. 12A.

DESCRIPTION OF THE PREFERRED EMBODIMENTS

Hereinafter, preferred embodiments of the present invention will be described with reference to the accompanying drawings.

First Embodiment

Figure 1:
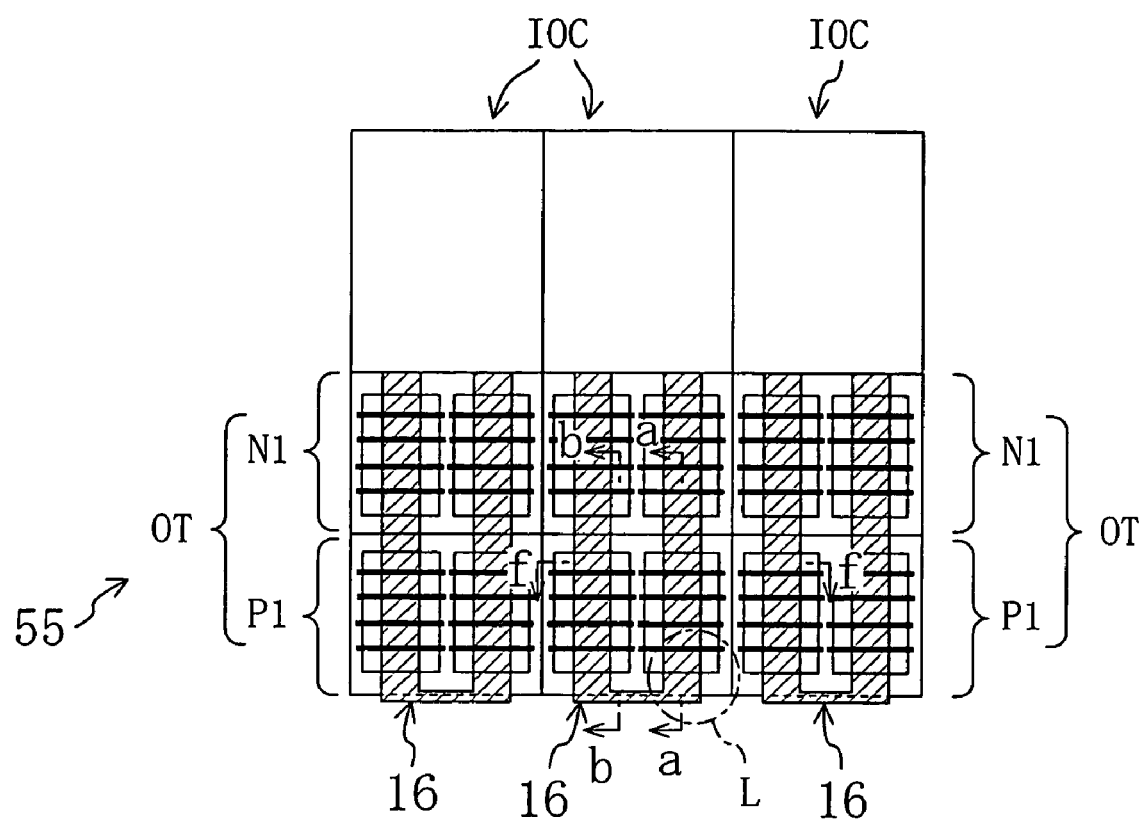
FIG. 1 is a plan view illustrating an arrangement of an I/O circuit unit, i.e., a semiconductor device according to a first embodiment of the present invention.

FIG. 1 is a plan view illustrating a specific arrangement of a semiconductor device according to a first embodiment of the present invention.

Figure 2B:
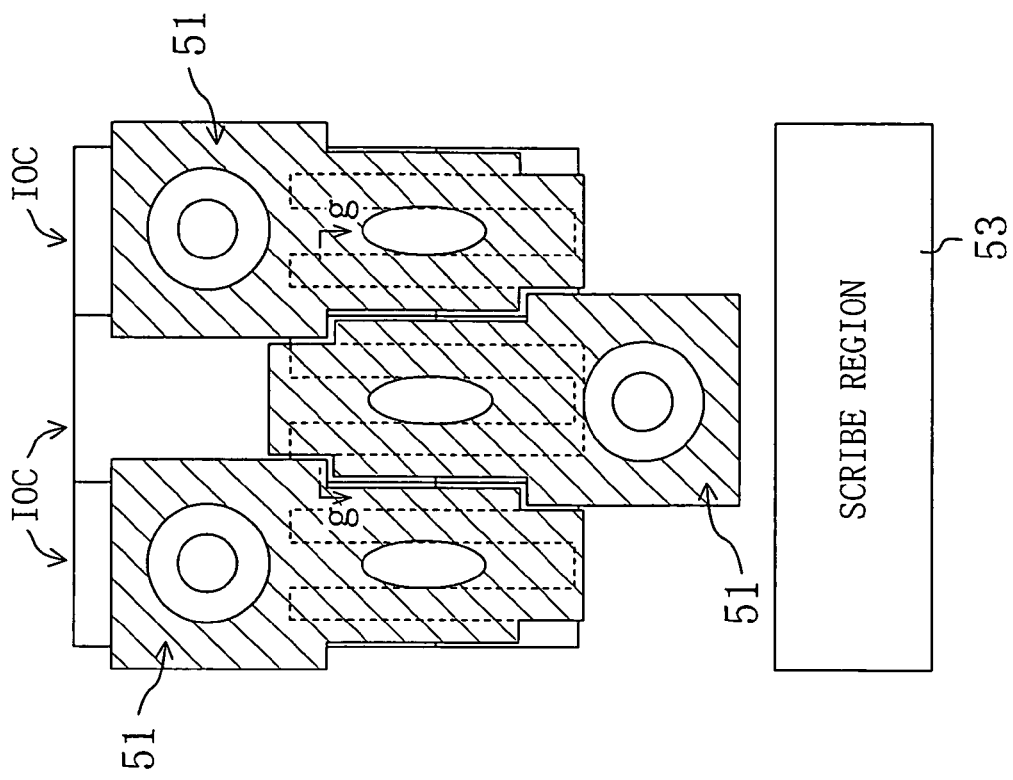
FIG. 2B is a plan view illustrating an arrangement of upper one of the two layers constituting the pad cell.
Figure 2A:
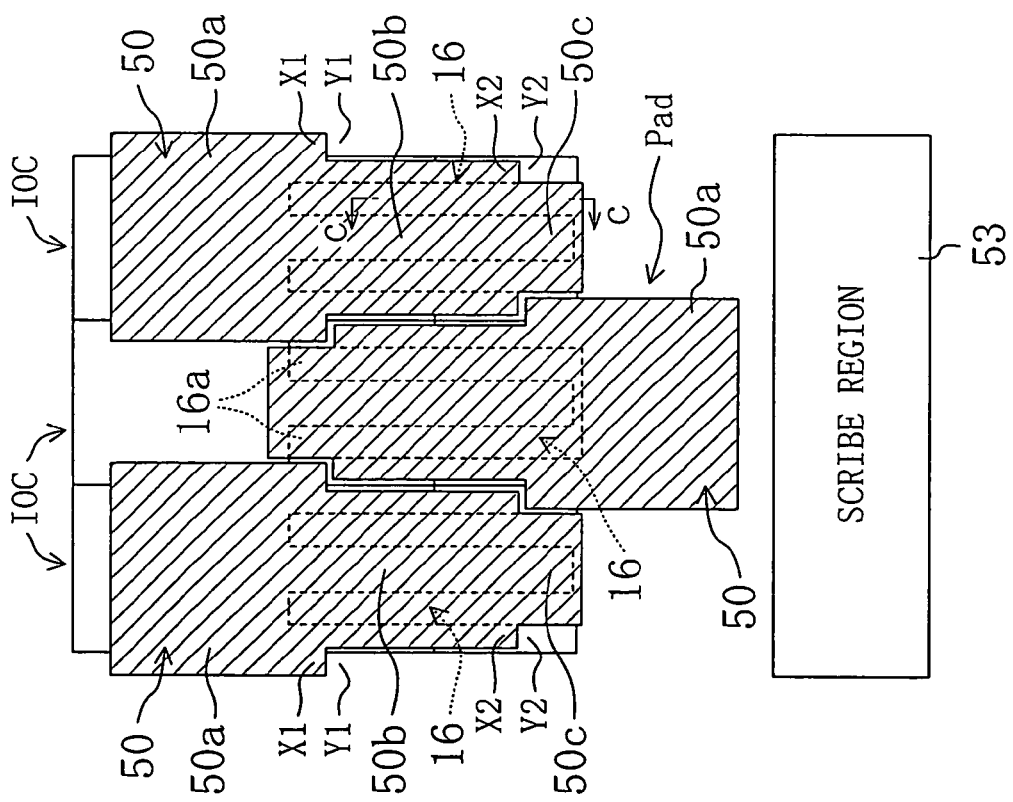
FIG. 2A is a plan view illustrating an arrangement of lower one of two layers constituting a pad cell forming part of the I/O circuit unit.

FIG. 1 shows the arrangement of major part of an I/O circuit unit provided in the periphery of a semiconductor chip, in which a plurality (e.g., three in FIG. 1) I/O cells IOC are arranged in lines. FIGS. 2A and 2B are views illustrating an arrangement in which an electrode pad cell is provided over each of the three I/O cells IOC.

Figure 3A:
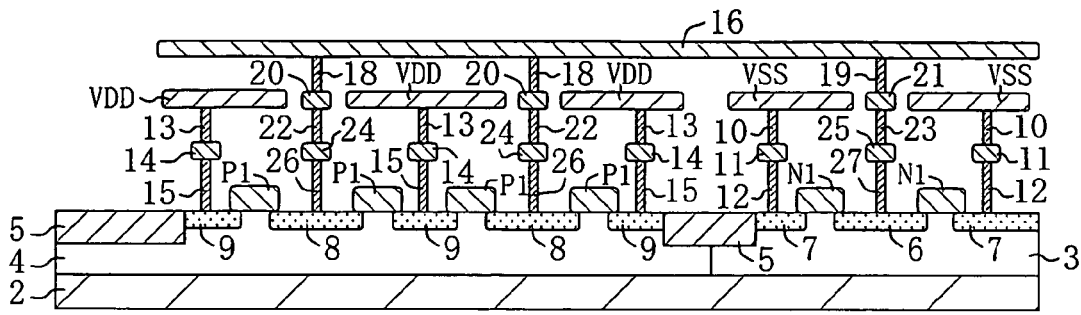
FIG. 3A is a cross-sectional view of the I/O cell of FIG. 1 taken along the line a—a.
Figure 3B:
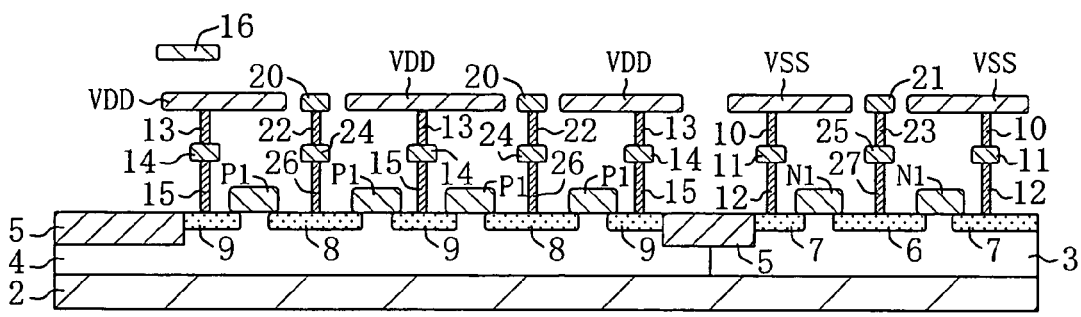
FIG. 3B is a cross-sectional view of the I/O cell of FIG. 1 taken along the line b—b.

First, the structure of each of the I/O cells IOC will be described. FIG. 3A is a cross-sectional view taken along the line a-a shown in FIG. 1. FIG. 3B is a cross-sectional view taken along the line b—b shown in FIG. 1. In FIGS. 3A and 3B, 2 denotes a p-type semiconductor substrate, 3 and 4 denote p-type and n-type wells formed on the semiconductor substrate 2, respectively. Four separate NMOS transistors N1 are provided on the p-type well 3, and four separate PMOS transistors P1 are provided on the n-type well 4. The n-type MOS transistors N1 are isolated from the p-type MOS transistors P1 by an isolation region 5. Moreover, in FIGS. 3A and 3B, 6 and 7 denote n-type doped regions, which serve as the drain and source of the n-type MOS transistors N1, respectively, and 8 and 9 denote p-type doped regions, which serve as the drain and source of the p-type MOS transistors P1, respectively. The four n-type MOS transistors N1 and the four p-type MOS transistors P1 are arranged in line, respectively, so that four output transistors OT are formed by these MOS transistors. Other two lines each including four output transistors OT are further provided.

Furthermore, VSS denotes a ground line at the ground potential provided in the second wiring layer and VDD denotes a power line at a predetermined potential provided in the second wiring layer. The ground line VSS is connected to the n-type doped region 7 serving as the source of the n-type MOS transistor N1 via a via hole 10, an isolated wiring region 11 provided in a first wiring layer, and a via hole 12. In the same manner, the power line VDD is connected to the p-type doped region 9 serving as the source of the p-type MOS transistors P1 via a via hole 13, an isolated wiring region 14 provided in the first wiring layer, and a via hole 15.

Furthermore, 16 denotes a connection line (wiring) made of a metal wiring (e.g., copper), which is provided in an upper most layer (i.e., the third wiring layer). The connection line 16 is connected to the electrode pad cell Pad provided over the connection line 16. Moreover, as shown in FIG. 1, the connection line 16 is formed into a U shape so as to be present over all of the output transistors OT. The connection line 16 is connected to the drain of the p-type MOS transistors P1 (i.e., the p-type doped region 8) via a stacked via structure including a via hole 18, an isolated wiring region 20 provided in the second wiring layer, a via hole 22, an isolated wiring region 24 provided in the first wiring layer, and a via hole 26, and also connected to the drain of the n-type MOS transistors N1 (i.e., the n-type doped region 6) via a stacked via structure including a via hole 19, an isolated wiring region 21 provided in the second wiring layer, a via hole 23, an isolated wiring region 25 provided in the first wiring layer, and a via hole 27. Thus, the respective drains of the p-type and n-type MOS transistors P1 and N1 (the p-type and n-type doped regions 6 and 8) are connected to the electrode pad cell Pad to share the electrode pad cell Pad.

Each of the output transistors OT outputs a signal of an internal circuit to the outside through the electrode pad cell Pad and also inputs a signal from the outside into the internal circuit. Furthermore, all of the output transistors OT have the same structure and also function as ESD protection transistors (protection transistors). Hereinafter, the output transistors OT are referred to as "ESD protection transistors". The ESD protection transistors OT release a positive or negative high voltage of an electrostatic discharge, which comes from the electrode pad cell Pad into the ESD protection transistors, to the power line VDD through the p-type MOS transistors P1 or to the ground line VSS through the n-type MOS transistors N1 to protect the internal circuit (not shown) from an electrostatic discharge, and forms a protection circuit 55.

Next, a specific arrangement of the electrode pad cell Pad will be described. All of the electrode pad cells Pad located over the I/O cells IOC, respectively, have the same structure. Each of the electrode pad cells Pad has a two-layer structure including an electrode pad 50 formed in the uppermost wiring layer (i.e., the third wiring layer) of an associated one of the I/O cells IOC, as shown in FIG. 2A, and an electrode pad 51 provided in a metal wiring layer (e.g., aluminum) located on the uppermost wiring layer, as shown in FIG. 2B. The electrode pads 50 and 51 are connected to each other via a via hole (not shown in FIGS. 2A and 2B).

In each of the electrode pad cells Pad, the electrode pad 50 located in the lower one of the two layers of the structure contains part of the U shaped connection line 16 formed in the third layer which is the lower layer in which the electrode pad 50 is located, i.e., the uppermost layer of the associated one of the I/O cells IOC and also covers the protection circuit 55 of the associated one of the I/O cells IOC. The electrode pad 51 located in the upper layer has the same shape as that of the electrode pad 50 located in the lower layer. Furthermore, the electrode pad cells Pad are arranged in a zigzag manner, so that a separation rule between the electrode pad cells Pad is satisfied. Note that FIGS. 2A and 2B, 53 denotes a scribe region which is cut out when the semiconductor chip is cut.

Figure 3C:
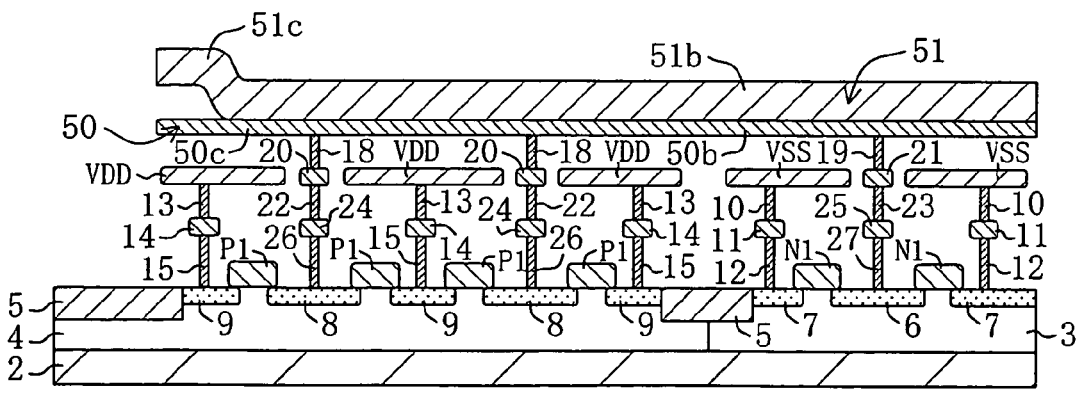
FIG. 3C is a cross-sectional view of the I/O cell of FIG. 1 taken along the line c—c.

Next, a specific arrangement of the electrode pad cells Pad will be described. The electrode pads 50 and 51 which constitute each of the electrode pad cells Pad and are formed in two layers, respectively, have the same shape or similar shape. Therefore, the electrode pad 50 located in the lower one of the two layers will be hereinafter described. The electrode pad 50 includes three pad portions 50a, 50b and 50c having different widths. A first pad portion 50a having the largest width is connected to a second pad portion 50b having the second largest width, and then the second pad portion 50b is connected to a third pad portion 50c. The first pad portion 50a is a bonding electrode region and has a large area enough to allow bonding of an external connection line (not shown) for outputting an output of each of the output transistors OT to the outside and inputting an output from the outside. Moreover, the second pad portion 50b is a test electrode region with which a probe-pin of a test tool is brought into contact and has a predetermined small area. The width of the second pad portion 50b is substantially the same as that of the associated one of the I/O cells IOC. Furthermore, the third pad portion 50c, as can be seen from FIG. 2A, is present in a range in which the second pad portion 50b for use in test is not present over both of end portions 16a of the U shaped connection line 16. That is to say, the third pad portion 50c is present over a center portion(s) of one or several ones of the ESD transistors OT constituting the protection circuit 55 located in an end portion shown in FIG. 3C.

Along with the connection of the first and second pad portions 50a and 50b having different widths, the electrode pad 50 includes a protruding portion x1 having a predetermined width in part of a connection potion of the first and second pad portions 50a and 50b located closer to the first pad portion 50a and a recessed portion y1 in part of the connection portion located closer to the second pad portion 50b, In the same manner, a protruding portion x2 having substantially the same width as that of the protruding portion x1 is formed in part of a connection portion of the second and third pad portions 50b and 50c located closer to the second pad portion 50b and a recessed portion y2 is formed in part of the connection portion located closer to the third pad portion 50c.

The I/O cells IOC each of which is formed so as to have a small width are arranged without any space therebetween. That is to say, a pitch between the I/O cells IOC is reduced. On the other hand, the first pad portion 50a of the electrode pad 50 is formed so as to have a large width enough to reliably allow bonding. That is to say, the width of the first pad portion 50a is larger than that of an associated one of the I/O cells IOC. Accordingly, the first pad portion 50a of the electrode pad 50 provided in the associated one of the I/O cells IOC has part extending over the adjacent one of the I/O cells IOC by a predetermined distance, i.e., the width of the protruding portion x1, in the inward direction of the adjacent I/O cell IOC.

Now, two adjacent electrode pads 50 are provided so that one of the electrode pads is arranged reversely to the other. Furthermore, in this state, the protruding portion x1 of the first pad portion 50a of one of the two electrode pads 50 fits in the recessed portion y2 of the third pad portion 50c of the other one of the two electrode pads 50 while the protruding portion x2 of the second pad portion 50b of the one of the two electrode pads 50 fits in the recessed portion y1 of the second pad portion 50b of the other one of the two electrode pads 50.

Next, the location of the U shaped connection line 16 provided in the uppermost layer of each of the I/O cells IOC and connected to an associated one of the electrode pads 50 will be described.

Figure 4A:
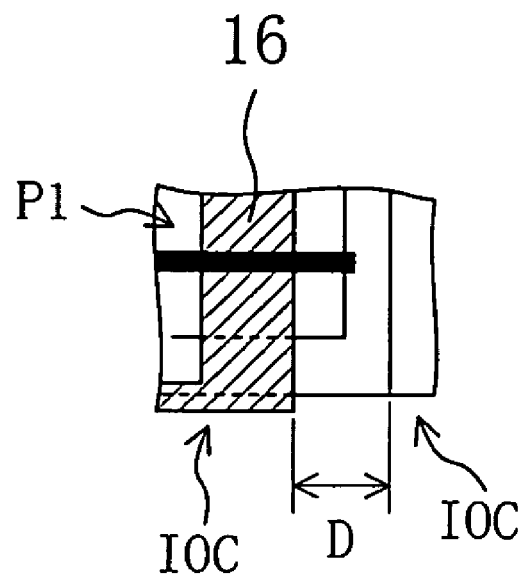
FIG. 4A is an enlarged view of an encircled part of the I/O cell of FIG. 1.
Figure 4B:
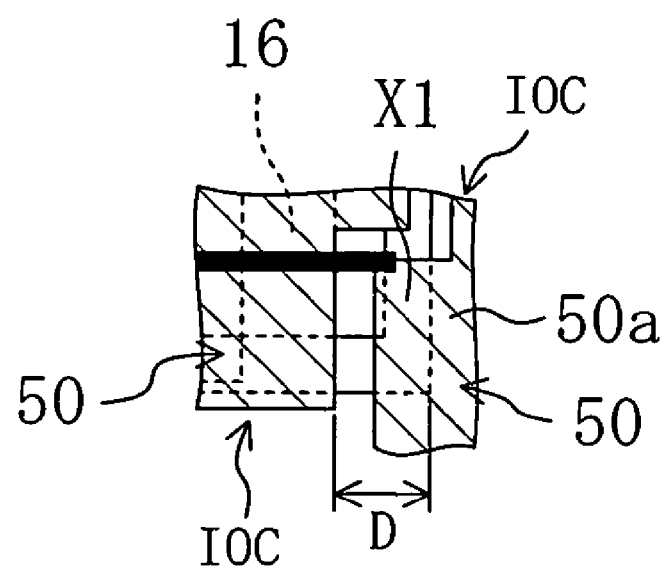
FIG. 4B is a plan view of the encircled part in which an electrode pad is present over the I/O cell.

FIG. 4A is an enlarged view of an encircled part shown in FIG. 1. In FIG. 4A, the connection line 16 is provided so that an end portion thereof is located at a predetermined distance D inwardly from an end portion of the associated one of the I/O cells IOC. As shown in FIG. 4B, the predetermined distance D is a larger distance than a distance by which part of the first pad portion 50a of the adjacent one of the I/O cells IOC extends over the associated one of the I/O cells IOC in the inward direction of the associated one of the I/O cells IOC, i.e., a distance substantially equal to the width of the protruding portion x1.

In this embodiment, in each of the I/O cells IOC, the electrode pad 50 is provided over the protection circuit 55. Thus, compared to the case where the electrode pad is provided so as to be located next to the protection circuit 55, an arrangement area can be effectively reduced. Furthermore, respective electrode pads 50 of the I/O cells IOC are arranged in a zigzag manner. Thus, even when the width of the I/O cells IOC is reduced to have a reduced pitch between the I/O cells IOC, the separation rule can be satisfied.

Moreover, as can be seen from FIGS. 1 and 2A, in each of the I/O cells IOC, the electrode pad 50 is present over the connection line 16 located over the ESD protection transistors OT constituting the protection circuit 55. More specifically, the third pad portion 50c having the smallest width is present over a center portion(s) of one or several ESD protection transistors OT located in an end portion. Accordingly, as can be seen from FIG. 3C, each of the drains of the p-type and n-type MOS transistors P1 and N1 (i.e., the p-type and n-type doped regions 8 and 6) constituting all of the ESD protection transistors OT is connected to an electrode pad 50 located directly over the drain via the stacked via structure including the via holes 18 and 19, while the electrode pad 50 is connected to an electrode pad 51 located over the electrode pad 50, so that the connection impedance between the each of the electrode pad cells Pad and an associated one of all of the ESD protection transistors OT is uniform. Therefore, when a high potential of an electrostatic discharge is applied to the electrode pad cells Pad, high potentials applied to the ESD protection transistors OT are substantially the same and are not concentrated in any one of the ESD protection transistors. As a result, without causing destruction of the ESD protection transistors OT, a positive or negative high voltage of an electrostatic discharge is released to the power line VDD and the ground line VSS via each of the ESD protection transistors OT to effectively protect the internal circuit from an electrostatic discharge.

More specifically, as shown in FIG. 2A, in the arrangement in which the protruding portions x1 and x2 of the electrode pad 50 of the associated one of the I/O cells IOC fit in the recessed portions y1 and y2, respectively, the second pad portion 50b of the electrode pad 50 of the associated one of the I/O cells IOC is interrupted by the first pad portion 50a of the electrode pad 50 of an adjacent one of the I/O cells IOC. Therefore, the second pad portion 50b can not further extend in the forward direction with the width unchanged. However, in this embodiment, the third pad portion 50c having a smaller width than that of the second pad portion 50b is connected to the second pad portion 50b and located in the front of the second pad portion 50b. Thus, the third pad portion 50c is made to be present over one or several ones of the ESD protection transistors OT located in an end potion, thereby reducing the connection impedance between the one or several ones of the ESD protection transistors OT and the electrode pad 50.

Furthermore, the electrode pad cells Pad of the I/O cells IOC are provided so that one of adjacent two cells is arranged reversely to the other. Accordingly, two different electrode pad cells do not have to be made, so that all of the I/O cells IOC can be formed of the one type of electrode pad cells.

Figure 5A:
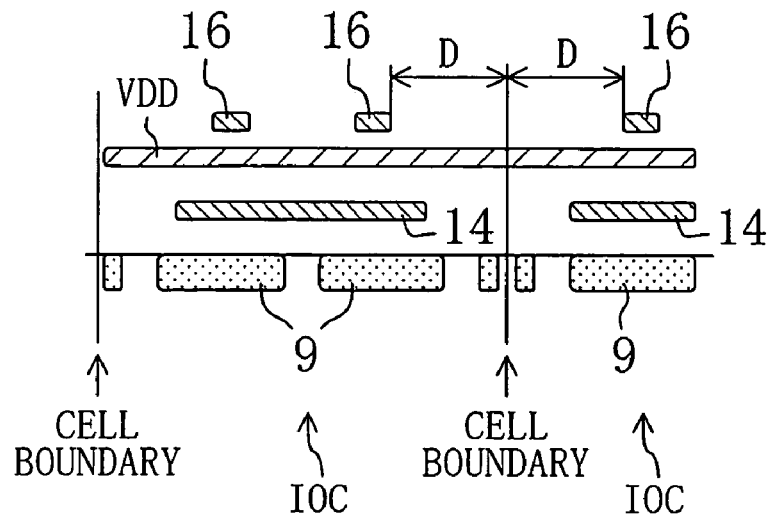
FIG. 5A is a cross-sectional view of the I/O cell of FIG. 1 taken along the line f—f.
Figure 5B:
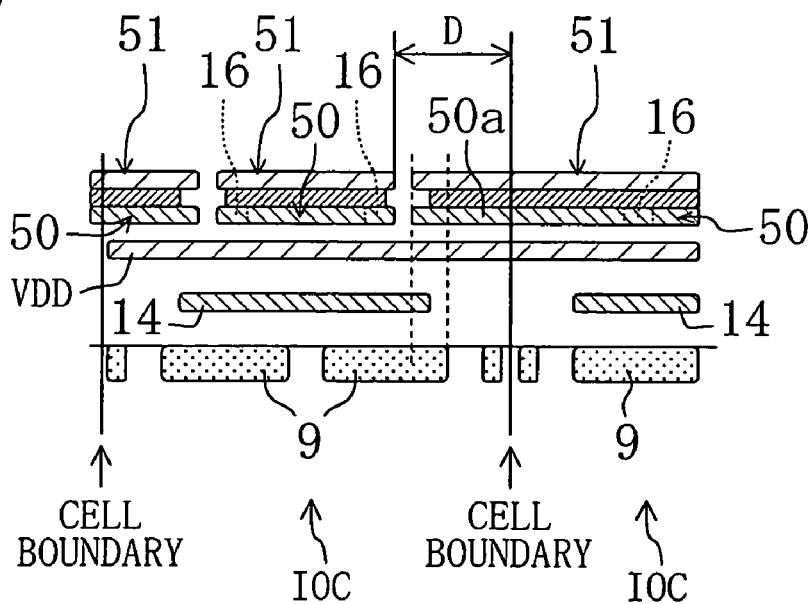
FIG. 5B is a cross-sectional view of the I/O cell of FIG. 2 taken along the line g—g.
Figure 7:
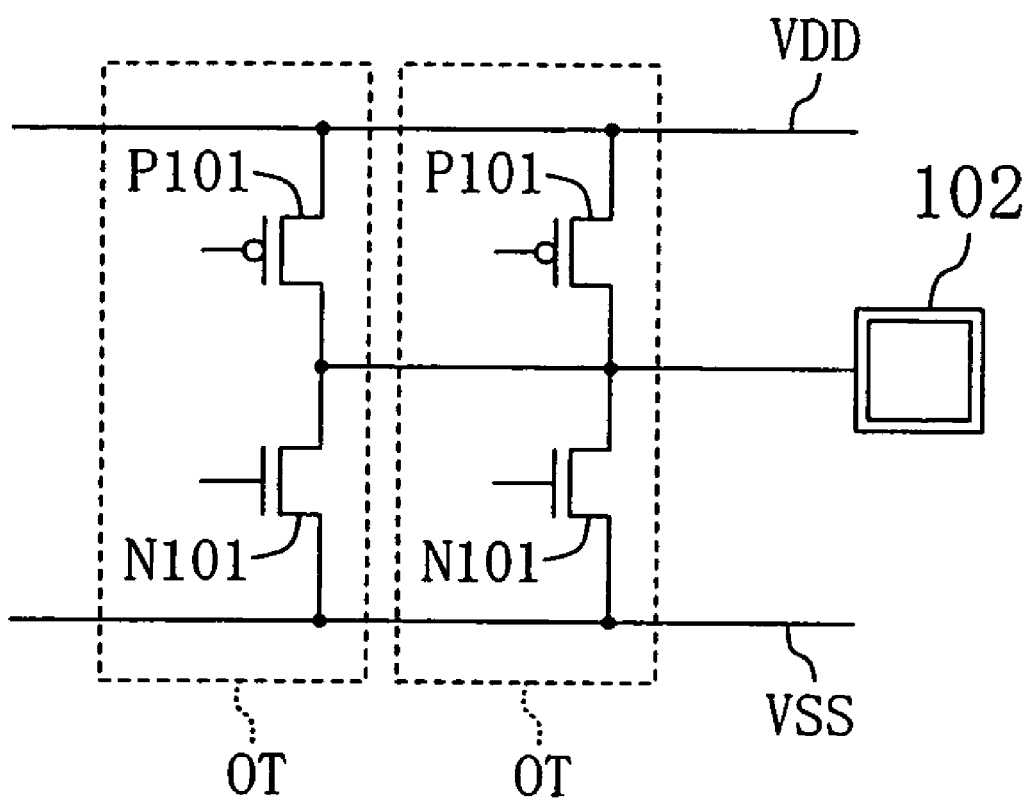
FIG. 7 is a circuit diagram illustrating the circuit configuration of a known I/O circuit unit.
Figure 8:
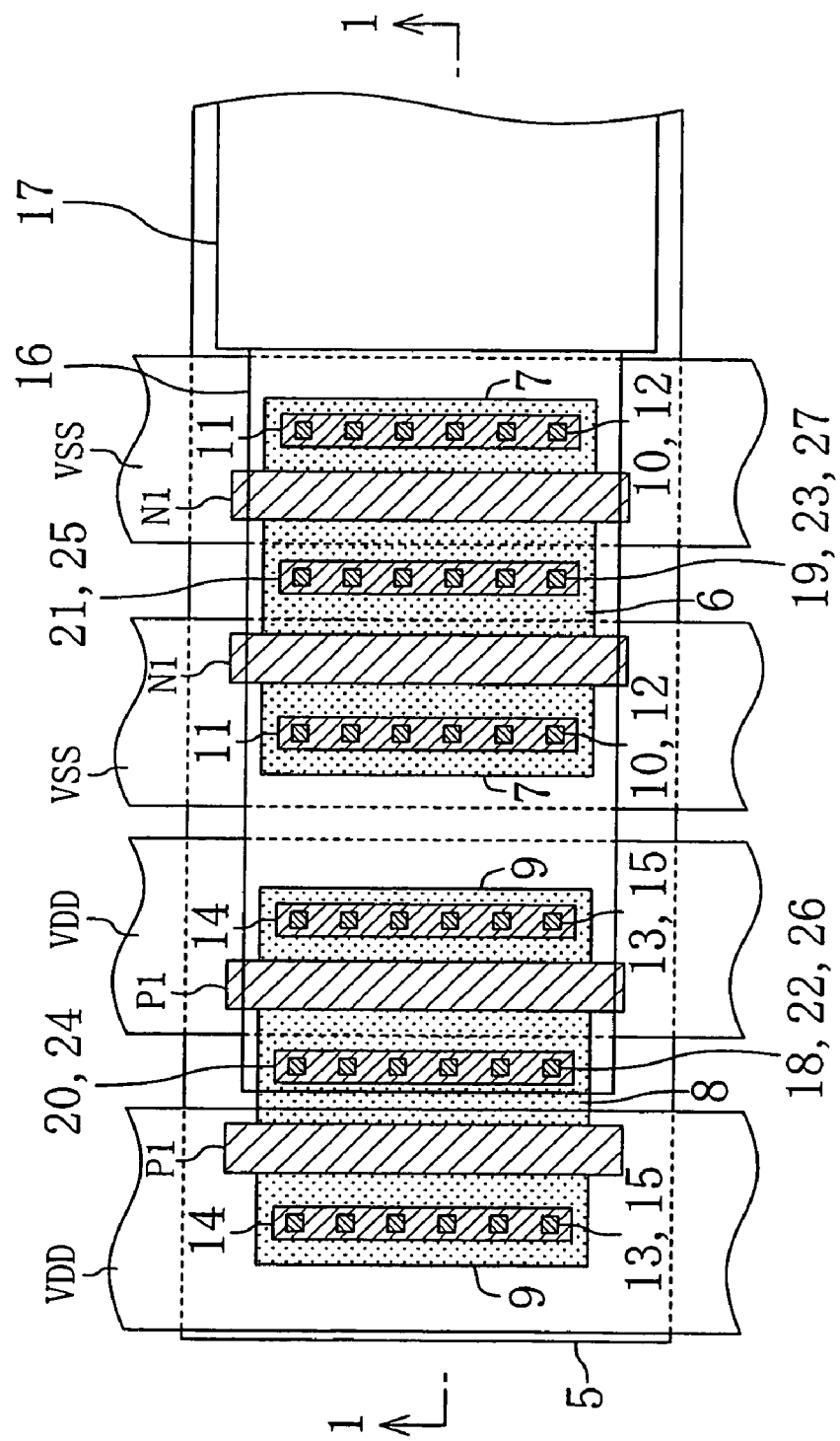
FIG. 8 is a specific layout of the I/O circuit unit.
Figure 9:
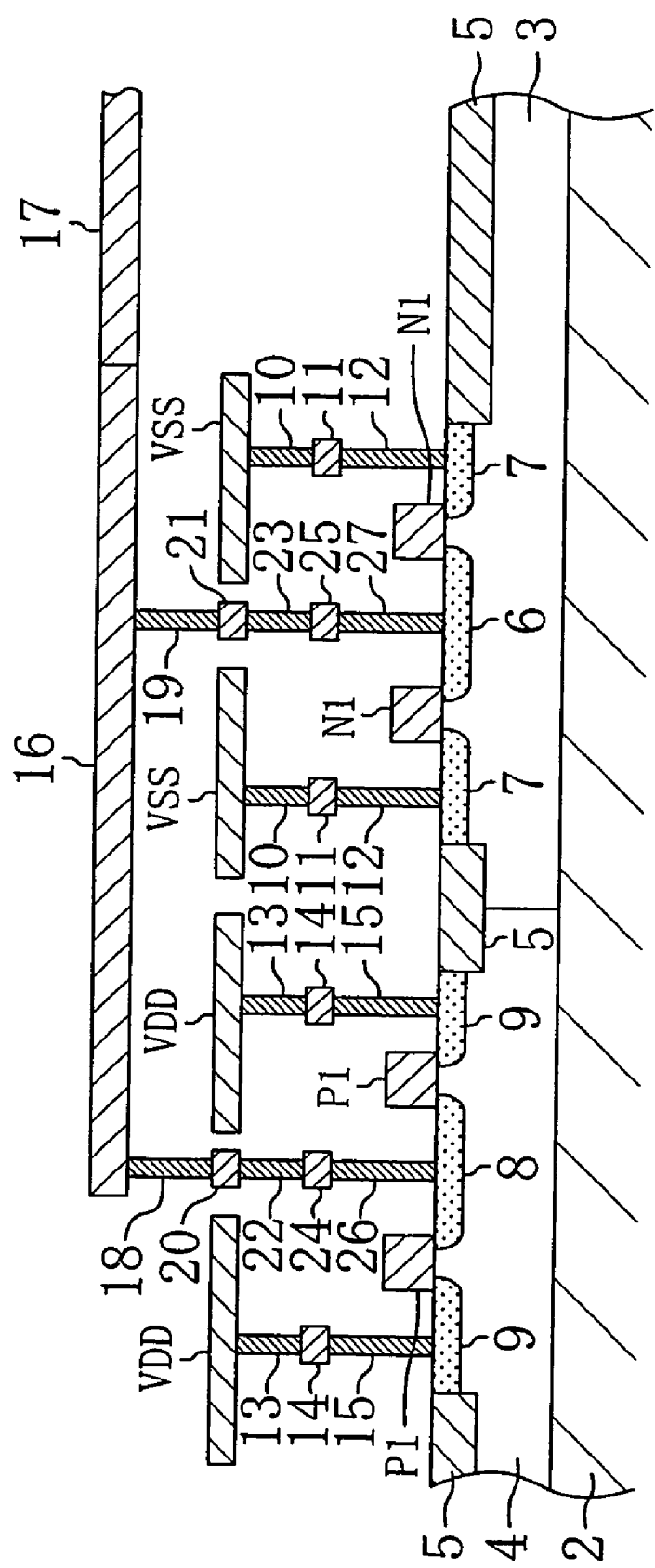
FIG. 9 is a cross-sectional view of the I/O circuit unit taken along the line 1—1 of FIG. 8.
Figure 10:
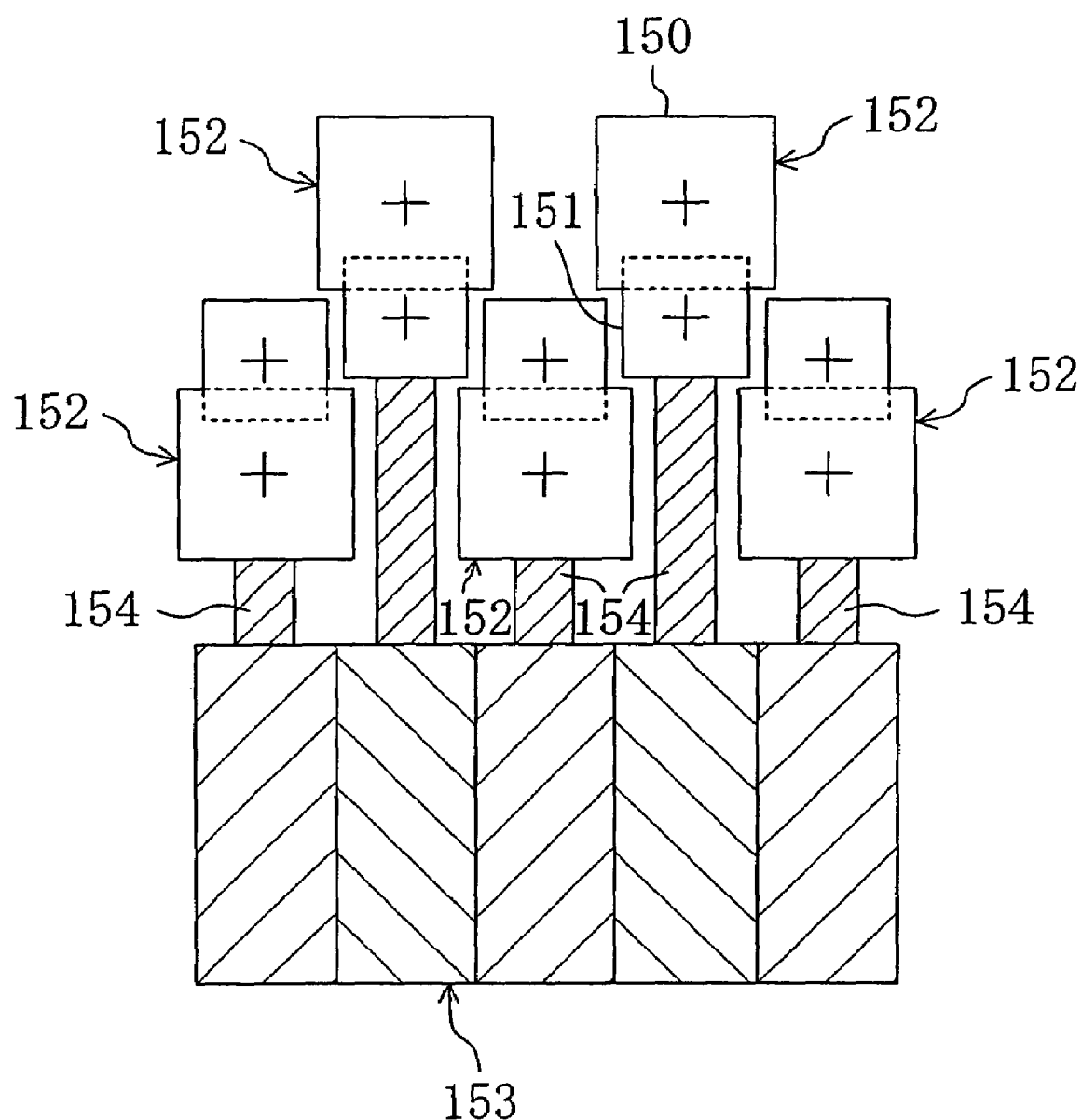
FIG. 10 is a view illustrating a zigzag arrangement of electrode pads in the known semiconductor device.
Figure 11:
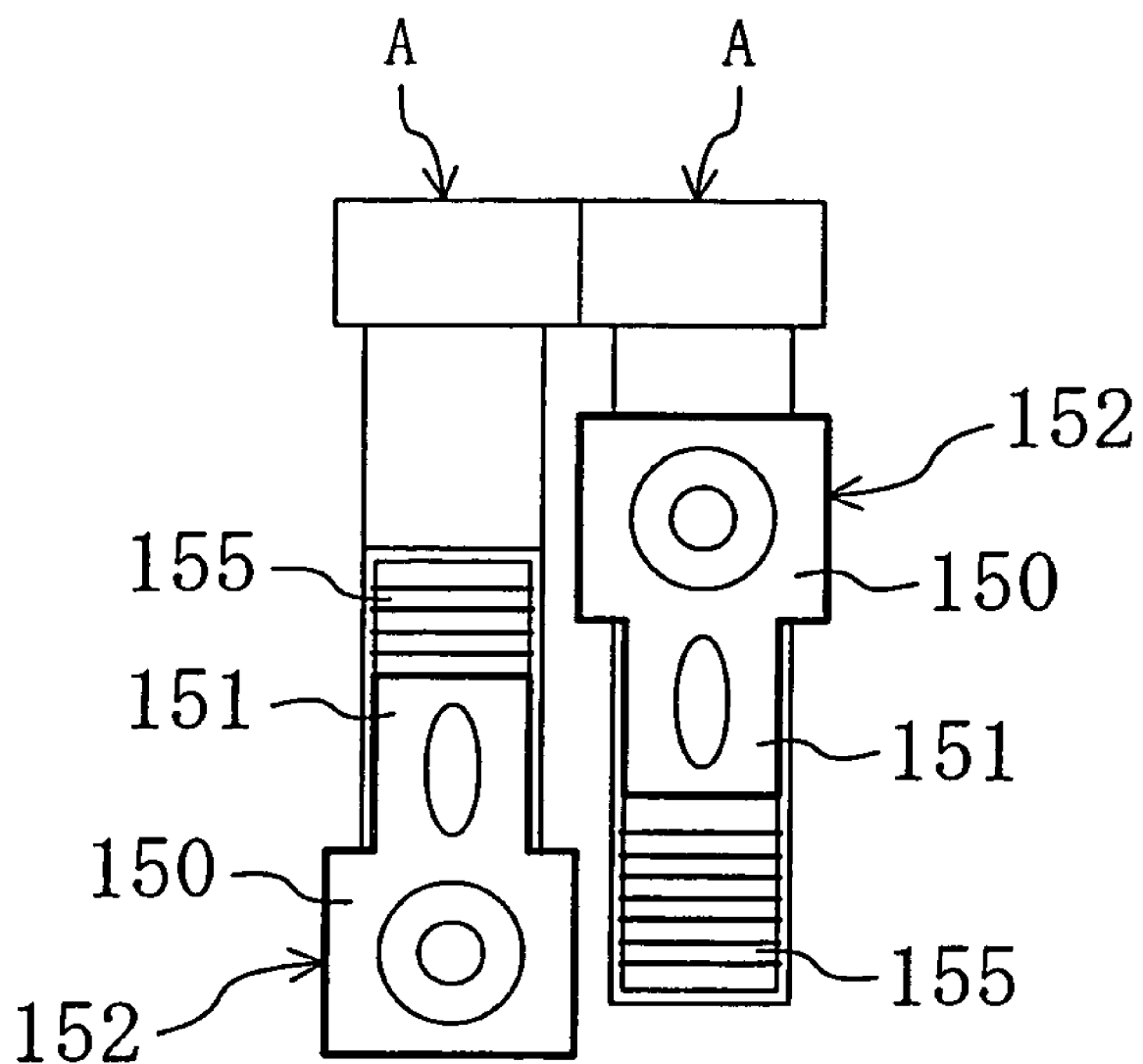
FIG. 11 is a view illustrating an arrangement in which a multi-stepped electrode pad is present over an ESD protection transistor.
Figure 13:
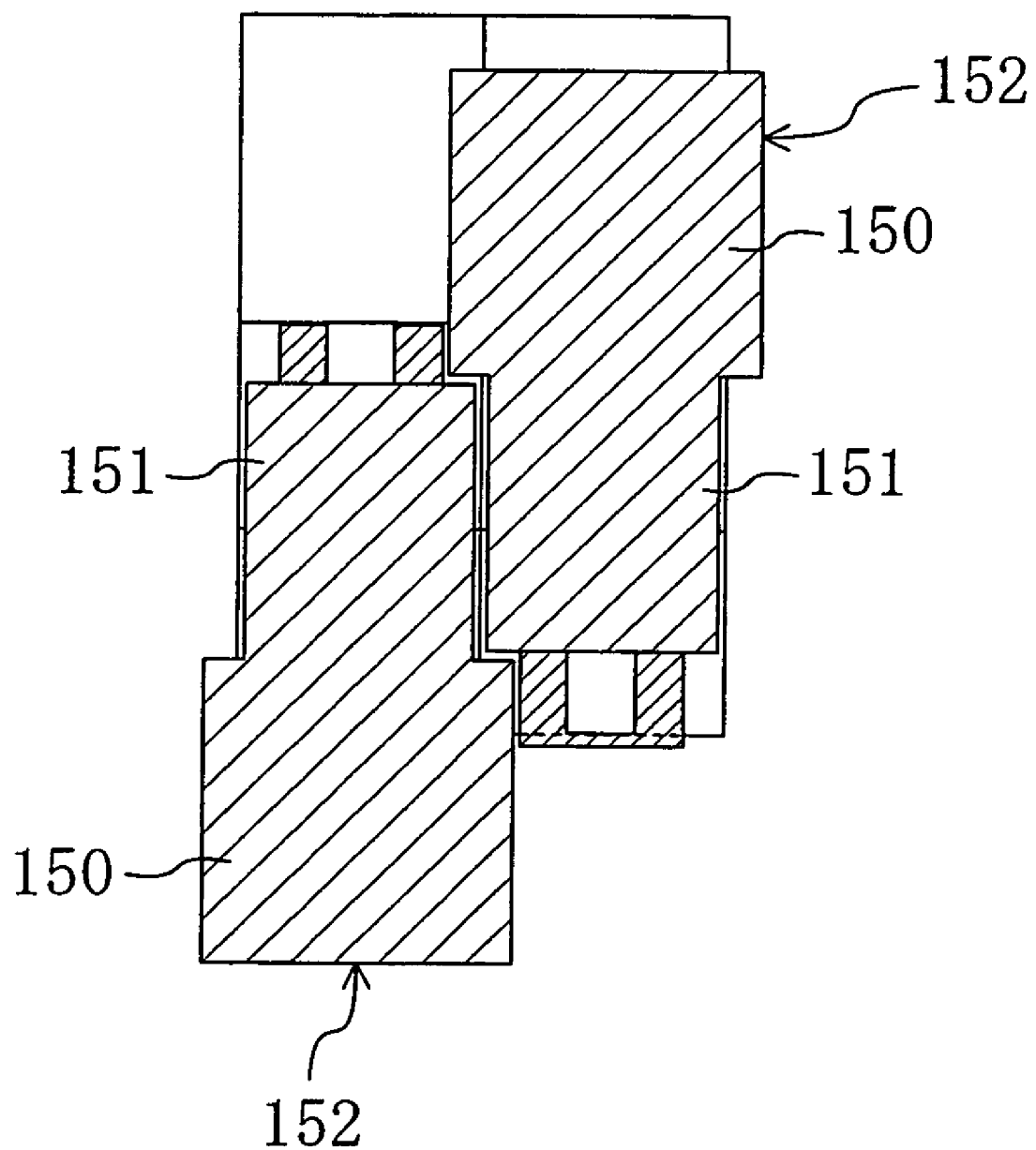
FIG. 13 is a view illustrating an arrangement in which a pitch between electrode pads is reduced and a multi-stepped electrode pad is present over each of I/O cells arranged without any space therebetween.

In addition, in the case where the width of the I/O cells IOC is reduced so that a pitch between the I/O cells IOC is reduced, the width of the first pad portion 50a, i.e., the bonding electrode region of the electrode pad 50 has to be larger than that of the I/O cells IOC. FIGS. 5A and 5B are cross-sectional views of the I/O cells of FIG. 1 taken along the lines f—f and g—g, respectively. In this case, as shown in FIGS. 5A and 5B, in the uppermost layer (i.e., the third layer), the first pad portion 50a of the electrode pad 50 provided in the associated one of the I/O cells IOC has part extending over an adjacent one of the I/O cells IOC by the width of the protruding portion x1 in the inward direction of the adjacent one of the I/O cells IOC. In the adjacent one of the I/O cells IOC, the connection line 16 for connecting to the electrode pad 50 of the associated one of the I/O cells IOC is set to be at a position in the uppermost layer (i.e., the third layer) located at a larger distance than the width of the protruding portion x1 from an edge of the associated one of the I/O cells IOC in the inward direction of the adjacent one of the I/O cells IOC. Accordingly, assume that an electrode pad 50 having a large width is used. Even if the first pad portion 50a of the electrode pad 50 has part extending over the adjacent one of the I/O cells IOC in the inward direction of the adjacent one of the I/O cells IOC, the first pad portion 50a which has the part extending over the adjacent one of the I/O cells IOC in the inward direction of the adjacent I/O cell IOC does not contain part of the connection line 16 of the associated one of the I/O cells IOC. Thus, even in the case where an electrode pad having a different shape, for example, in the case where an electrode pad 50 including a first pad portion 50a having a larger width than that of the I/O cells IOC is used as an electrode pad and in the case where an electrode pad 50 having a smaller width than that of the I/O cells IOC is used as an electrode pad, even in the case where an in-line arrangement in which a power supply pad is located on a side of an I/O cell IOC is used, or even in the case where the electrode pad cells Pad are arranged in a zigzag manner over the I/O cells IOC as in this embodiment, the I/O cells IOC of one type can be used as electrode pads. Therefore, efficiency in development of libraries of I/O cells IOC can be increased.

Second Embodiment

Hereinafter, a second embodiment of the present invention will be described with reference to FIGS. 6A through 6C.

In this embodiment, an electrode pad cell is used as a power supply terminal cell. In FIG. 6A, an I/O cell IOC' has a structure in which each of end portions of a U shaped connection line 16' provided in an uppermost layer widely extends toward an internal circuit provided in a semiconductor chip (located in an upper portion in the structure of FIG. 6A, but not shown).

Moreover, in FIG. 6B, the electrode pad cell Pad' has a structure in which the third pad portion 50c of a lower electrode pad (power terminal pad) 50' which contains part of the connection line 16' and has the smallest width or the first pad portion 50a' of the lower electrode pad 50' extends toward the inner circuit. An upper electrode pad 51' shown in FIG. 6C has the same structure as that of the lower electrode pad 50' in which counterparts of the first pad portion 50a' or the third pad portion 50c' extends toward the internal circuit.

Accordingly, in this embodiment, an entire power supply terminal cell having a larger width than that of the connection line 16' extends to reach the vicinity of the inner circuit. Therefore, the impedance of the power supply line can be effectively reduced, so that excellent power supply is performed.

Note that in the description above, the electrode pads 50 and 50' are formed so that the electrode pad 50 includes three portions 50a, 50b and 50c having different widths and the electrode pads 51 includes three portions 50a', 50b' and 50c' having different widths. However, the present invention is not limited thereto but an electrode pad may include four or more pad portions having different widths.

What is claimed is:

1. A semiconductor device in which a plurality of cells each including an output transistor formed on a substrate and a protection circuit having a plurality of protection transistors for protecting an internal circuit from an electrostatic discharge are arranged in line,
   wherein each said cell includes an electrode pad which outputs an output of the output transistor to the outside and is connected to the plurality of protection transistors of the protection circuit, and
   wherein each of the electrode pads of the plurality cells is located over an associated one of the plurality of the cells, and the electrode pads are arranged in a zigzag manner and are present over a connection line of the plurality of protection transistors of the protection circuit provided in the associated one of the cells.

2. The semiconductor device of claim 1, wherein the electrode pad of each said cell includes three or more pad portions which have different widths and are sequentially connected to one another and is formed in a multi-step structure having a protruding portion and a recessed portion.

3. The semiconductor device of claim 2, wherein the electrode pad of each said cell includes a first pad portion having the largest width, a second pad portion having the second largest width, and a third pad portion having the smallest width.

4. The semiconductor device of claim 2, wherein one of the plurality of the pad portions having the smallest width is present over at least a center portion of at least one of the plurality of protection transistors located in an end portion.

5. The semiconductor device of claim 1, wherein one of the pad portions having the largest width has a larger width than that of the associated cell and has part extending by a predetermined distance over an adjacent one of the plurality of cells in the inward direction of the adjacent cell.

6. The semiconductor device of claim 5,
wherein each said cell includes a line provided in an uppermost layer so as to be connected to the electrode pad for outputting to the outside an output of the output transistor of each said cell, and
wherein the line is provided at a larger distance than the predetermined distance from an end portion of the associated cell in the inward direction of the associated cell.

7. The semiconductor device of claim 1, wherein the electrode pad of one of the plurality of the cells and the electrode pad of an adjacent one of the plurality of the cells are provided so that one of the electrode pads is arranged reversely to the other.

8. The semiconductor device of claim 7, wherein a protruding portion of one of the respective electrode pads of the two adjacent cells fits in a recessed portion of the other one of the electrode pads.

9. The semiconductor device of claim 2, wherein in the electrode pad of one of the plurality of cells, one of the pad portions having the smallest width or one of the pad portions having the largest width has part extending in the inward direction of the inner circuit.

10. The semiconductor device of claim 8, wherein the electrode pad is a power supply terminal pad for supplying a predetermined voltage to the inner circuit.

11. The semiconductor device of claim 2, wherein an external connection line for outputting to the outside an output of the output transistor is bonded to one of the pad portions having the largest width.

12. The semiconductor device of claim 2, wherein a pad portion other than one of the pad portions having the largest width is used for testing the internal circuit.

13. The semiconductor device of claim 1,
wherein the electrode pad provided over an associated one of the plurality of cells includes a pad portion having a larger width than that of the associated cell,
the connection line is provided at a predetermined distance inwardly from a width-direction end portion of the cell, and
the predetermined distance between the connection line and the width-direction end portion of the associated cell in which the connection line is provided is set to be a larger distance than a distance by which part of the pad portion of the electrode pad extends in the inward direction of an adjacent cell to the associated cell beyond the width of the associated cell.

* * * * *